United States Patent
Shieh

(10) Patent No.: US 6,674,816 B2
(45) Date of Patent: Jan. 6, 2004

(54) VITERBI DETECTOR FOR EXTENDING TOLERABLE EXTENT OF DIRECT CURRENT BIAS

(75) Inventor: Jia-Horng Shieh, Junghe (TW)

(73) Assignee: Acer Laboratories Inc. (TW)

(*) Notice: Subject to any disclaimer, the term of this patent is extended or adjusted under 35 U.S.C. 154(b) by 546 days.

(21) Appl. No.: 09/740,842

(22) Filed: Dec. 21, 2000

(65) Prior Publication Data

US 2002/0021772 A1 Feb. 21, 2002

(30) Foreign Application Priority Data

Aug. 11, 2000 (TW) ........................ 89116291 A

(51) Int. Cl.[7] .................. H04L 27/06; H03M 13/03
(52) U.S. Cl. .................... 375/341; 714/794
(58) Field of Search ................. 375/341, 316, 375/262; 714/794, 795

(56) References Cited

U.S. PATENT DOCUMENTS 6,249,553 B1 * 6/2001 Honma ..................... 375/341
6,519,715 B1 * 2/2003 Takashi et al. ............... 714/32

* cited by examiner

*Primary Examiner*—Khai Tran
(74) *Attorney, Agent, or Firm*—Michael D. Bednarek; Shaw Pittman LLP

(57) ABSTRACT

A Viterbi detector for extending tolerable extent of DC bias is disclosed. By adding a fixed value to a reference level or subtracting a fixed value from the reference level, the tolerable extent of the DC bias of the input signal is increased. According to the invention, this effect can be achieved with a control circuit and the tolerable extent of the DC bias can be increased by about 100% as compared with the tolerable extent of the DC bias in the conventional approaches.

13 Claims, 12 Drawing Sheets

(a) INFORMATION CODE SIGNAL E  0 1 0 0 1 0 0 0 1 0 0 1 0 0 0 0 1 0 0 0 1 0

(b) NRZI CIRCUIT'S OUTPUT SIGNAL F  0 1 1 1 0 0 0 0 1 1 1 0 0 0 0 0 1 1 1 1 0 0

(c) LD DRIVING SIGNAL (d) PITS ON THE OPTICAL DISK (e) REPRODUCE SIGNAL G (f) PR EQUALIZER'S OUTPUT SIGNAL J (g) VITERBI DETECTOR'S OUTPUT SIGNAL Z  0 1 0 0 1 0 0 0 1 0 0 1 0 0 0 0 1 0 0 0 1 0

VITERBI DETECTOR FOR EXTENDING TOLERABLE EXTENT OF DIRECT CURRENT BIAS

BACKGROUND OF THE INVENTION

This application incorporates by reference Taiwan application Serial No. 89116291, filed Aug. 11, 2000.

1. Field of the Invention

The invention relates in general to a Viterbi detector for extending tolerable extent of direct current (DC) bias, and more particularly to a Viterbi detector, used in a partial response maximum likelihood (PRML) signal processing apparatus, for extending the tolerable extent of the DC bias.

2. Description of the Related Art

There are many approaches to the storage of information code in a recording medium. For the increasing the data access density, partial response maximum likelihood (PRML) signal processing is widely used in optical disk systems.

In the process of transmitting signals, when the channel bandwidth is lower than the bandwidth of the signals transmitted in the channel, inter-symbol interference (ISI) occurs in adjacent bits of the signals in the receiving end. When ISI is serious, it may cause jitter. As the recording density of optical disks increases, jitter caused by ISI becomes more serious, increasing the difficulty in phase-locking. For overcoming this phenomenon, the principle of partial response (PR) channel is applied. In PRML signal processing, the channel response is appropriately equalized in a channel response in terms of a PR polynomial. In this way, ISI is constrained and is in an expectable characteristic, resulting in reduction of jitter when ISI occurring. Thus, the performance of phase-locking is improved. In other words, PRML is potentially a technique of improving the recording density of optical disks.

Referring to FIG. 1, it illustrates a PRML signal processing apparatus in block diagram form. In FIG. 1, modulated information code E is first inputted into a return-to-zero inversion (NRZI) circuit 102. The modulated information code signal E is then processed by an exclusive-OR gate 104 and a delay element 106 of the NRZI circuit 102, resulting in an output signal F of the NRZI circuit. After that, the output signal F of the NRZI circuit is written to a recording medium 108, such as an optical disk. In addition, PR(1, 2, 1) equalization of the output signal F of the NRZI circuit is performed, where the minimum code reversal distance δ=2.

Referring now to FIG. 2, it illustrates the waveforms of the signals involved in FIG. 1 including the information code signal E, output signal F of the NRZI circuit, reproduce signal G, output signal J of the PR equalizer and output signal Z of the Viterbi detector, and the corresponding pits on the optical disk. In FIG. 2, the bit sequence in (a) corresponds to an example the information code signal E while the bit sequence in (b) illustrates the corresponding output signal F of the NRZI circuit. When the information code signal E has a signal level change of rising edge, the signal Z has a signal level change of itself as well; otherwise, the signal level of the signal Z remains unchanged. The signal in (c) is the LD driving signal produced according to the signal F and is used for controlling a LD (not shown in Figures) to perform write operation on the optical disk. Illustration in (d) is to show the pits on the optical disk which the LD performs the write operation on. The signal of (e) is the reproduce signal G corresponding to the data read from the optical disk by using the optical head. The signal of (f) is the output signal J of the PR equalizer 110 after the PR(1, 2, 1) process. And the signal of (g) is the output signal Z of the Viterbi detector 112 obtained after processing the signal J. The PR equalizer 110 and Viterbi detector 112 are called a reproduction signal processing unit 114.

In FIG. 2, when the signal F is in a 1 state, the LD driving signal is in the high level. Accordingly, a pit is produced on the optical disk. The reproduction signal processing unit 114 is used for generating the signal Z by the Viterbi detector using the reproduce signal G. The signal Z is theoretically identical to the information code signal E.

Referring to FIG. 3, it illustrates the Viterbi detector 112 in FIG. 1 in block diagram form. The Viterbi detector includes a branch metric calculation circuit 302, an add-compare-and-select (ACS) circuit 304 and a path memory unit 306. The branch metric calculation circuit 302 is for receiving the output signal J of the PR equalizer and calculating the values $B000_1$, $B000_2$, $B001_1$, $B011_1$, $B100_1$, $B110_1$, $B111_1$, and $B111_2$, called the branch metrics. The ACS circuit 304 is for outputting a path memory control signals H000 and H111 based on the branch metrics above. The path memory unit 306 is controlled by the path memory control signals H000 and H111, outputting the output signal Z of the Viterbi detector.

FIG. 4 is a block diagram of the branch metric calculation circuit 302 in FIG. 3. The branch metric calculation circuit 302 includes four subtractors 402, four multiplier 404, and four registers 406. In FIG. 4, the subtractors 402 respectively calculate J-0, J-0.25, J-0.75, and J-1. Next, the outputs of the subtractors are respectively processed by the multipliers 404 for obtaining the respective squares. Then, the four squares of the difference of the PR equalizer output signal J and four equalization-aimed values {0, 0.25, 0.75, 1} are stored in the delay units 406 respectively. The branch metric calculation circuit 302 outputs the branch metrics $B000_1$, $B000_2$, $B001_1$, $B011_1$, $B100_1$, $B110_1$, $B111_1$, and $B111_2$ respectively. For each point of time, the branch metrics are as follows:

$$B000_1=B000_2=(0-J)^2,$$

$$B001_1=B100_1=(0.25-J)^2,$$

$$B011_1=B110_1=(0.75-J)^2,$$

and $$B111_1=B111_2=(1.0-J)^2.$$

Referring now to FIG. 3, the branch metrics are inputted into the ACS circuit 304. The branch metrics represent the degree and nearness of the PR equalizer output signal J obtained from the PR(1, 2, 1) equalization of the reproduce signal, and the ideal PR(1, 2, 1) equalization signal.

The ACS circuit 304 uses six path metrics, P000, P001, P011, P100, P110, and P111, and the initial values of them are set to zero. The ACS circuit 304 derives the path metric at time t from the path metric and performs comparison of $P000(t)+B000_1(t)$ and $P100(t)+B100_2(t)$ as well as $P011(t)+B111_1(t)$ and $P111(t)+B111_2(t)$. From this, the ACS determines and outputs the path control signals H000(t) and H111(t).

Further, the ACS circuit 304 updates the values of the path metrics P000(t+1), P001(t+1), P011(t+1), P100(t+1), P110(t+1), and P111(t+1) according to the following expressions:

$$P000(t+1)=\min\{P000(t)+B000_1(t), P100(t)+B000_2(t)\},$$

$$P001(t+1)=P000(t)+B001_1(t),$$

$$P011(t+1)=P001(t)+B011_1(t),$$

$$P100(t+1)=P110(t)+B100_1(t),$$

$$P110(t+1)=P111(t)+B110_1(t),$$

and $$P111(t+1)=\min\{P011(t)+B111_1(t) \text{ and } P111(t)+B111_2(t)\}.$$

The path control signal H000 and H111 are respectively inputted into the path memory unit 306. The path memory unit 306 stores signal level transition patterns of the output signal J of the PR equalizer corresponding to each point of time in the form of a trellis. In addition, the path memory unit 306 only outputs binary signals. Moreover, when the PR equalizer's output signal J has noise, the Viterbi detector 112 selects the nearest signal level transition pattern according to the path control signals H000 and H111 for each point of time and stores the selected transition patterns in the path memory unit 306.

In another aspect, path metrics corresponds to the cost of a transition from the state at time t−1 to the state at time t. In this way, the Viterbi detector 112 is to calculate the cost of each path through the branch metrics, resulting in a path control signal (H000, H111) with the minimum cost. By the path control signal (H000, H111), the Viterbi detector 112 selects the required path to be stored in the path memory unit 306, obtaining the Viterbi detector's output signal Z.

In FIG. 2, it employs the ideal PR equalizer's output signal J for illustration, where the DC bias of the signal is set to zero. However, in some cases, the DC bias of the PR equalizer's output signal may be non-zero. In this way, the system performance is reduced.

Referring to FIGS. 5A–5C, they illustrates waveforms of a LD driving signal and the corresponding PR equalizer's output signal J with DC bias. FIG. 5A is the waveform diagram of the LD driving signal while FIG. 5B is the ideal PR equalizer's output signal J. FIG. 5C is the PR equalizer's output signal in practice.

Take the LD driving signal shown in FIG. 5A as an example, where the signal has many times of being in a high or low state for the time of 11T or 3T and T is the period of the clock. As shown in FIG. 5B, the corresponding PR equalizer's output signal J ideally has a constant DC level at any time. However, as shown in FIG. 5C, the DC level of the PR equalizer's output signal varies with the pattern of the LD driving signal. To be specific, when the LD driving signal is in a state for the time of 11T, the corresponding signal J in FIG. 5C has a DC level denoted as DC__11T. When the LD driving signal is in a state for the time of 3T, the DC level changes to another value denoted as DC__3T. However, for the DC level, the tolerance of the signal being in a state for 11T is greater than that for 3T. For the system to detect the signal when a state of the signal is lasting for 3T, the DC level of DC__3T is defined as the DC level of the signal in the system. In this case, a fixed DC bias occurs when the signal is in a state for 11T.

For illustrating the effects and the problems along with the DC bias, referring now to FIGS. 6A–6C, they illustrate another circuit structure and corresponding waveforms when DC bias occurs. As shown in FIG. 6A, a circuit structure for reproduction signal processing includes an analog-to-digital (A/D) converter 602 and the PR equalizer 110, and the Viterbi detector 112. In FIG. 6A, the A/D converter 602 is included and coupled to the PR equalizer 110. In this way, the PR equalizer is capable of performing digital or analog signal processing. Referring to FIG. 6B, it illustrates a waveform of the input signal P of the A/D converter 602. In FIG. 6B, the extent of the signal P is R1 while the operating extent of the A/D converter 602 is R2. If the extent R1 exceeds the operating extent R2, the output signal Q of the A/D converter 602 is illustrated in FIG. 6C. In FIG. 6C, the waveform of the signal Q near the peaks is truncated, leading to the DC bias occurs in the signal Q. As shown in FIG. 6C, the DC level of the signal P is DC__P while the DC level of the signal Q is DC__Q. Thus, the difference of DC__P and DC__Q is the DC bias of the signal Q. In this way, the signal Q has DC bias so that the output signal J of the equalizer has DC bias as well.

However, when the DC bias of the PR equalizer's output signal J is not zero, the performance of the Viterbi detector 112 will be greatly affected. In this way, in the analysis of the effect of the PR equalizer's output signal J with DC bias on the performance of the Viterbi detector 112, the bit error rate (BER) and signal-to-noise ratio (SNR) of the Viterbi detector's are employed.

It can be known that, according to the simulation where the SNR is a constant, the greater the DC bias is, the greater the BER is. Therefore, when the DC bias increases, the performance of the Viterbi detector decreases. In another situation that the system requires the BER is less than a fixed value, when the system SNR increases, the DC bias of the PR equalizer's output signal that the system can tolerate also decreases.

For resolving the DC bias' negative effects on the Viterbi detector's performance, the conventional method is to subtract the DC bias from the PR equalizer's output signal J and the result of this subtraction is then inputted into the Viterbi detector 112. However, in the case of DC bias occurring inside the system, it is more difficult to completely remove the DC bias from the PR equalizer's output signal. Therefore, the performance of the Viterbi detector 112 lowers.

SUMMARY OF THE INVENTION

It is therefore an object of the invention to provide a Viterbi detector for extending tolerable extent of DC bias. By adding a fixed value to a reference level or subtracting a fixed value from the reference level, the tolerable extent of the DC bias of the input signal is increased. According to the invention, the effect can be achieved by using a control circuit including registers.

According to the object of the invention, it provides a Viterbi detector for extending the tolerable extent of the direct current (DC) bias, for receiving a first signal. The Viterbi detector includes a first and second branch metric calculation circuits, a first and second add-compare-select (ACS) circuits, a first and second path memory units, and a control circuit. The first branch metric calculation circuit is for receiving the first signal and an equalization-aimed value increased by α% and outputting a first set of branch metrics. The second branch metric calculation circuit is for receiving the first signal and an equalization-aimed value decreased by α% and outputting a second set of branch metrics. The first ACS circuit is for receiving the first set of branch metrics and outputting a first set of path control signals and a first set of path metrics. The second ACS circuit is for receiving the second set of branch metrics and outputting a second set of path control signals and a second set of path metrics. The first path memory unit is for receiving the first set of path control signals and outputting a third signal while the second path memory unit is for receiving the second set of path control signals and outputting a fourth signal. The control circuit is for receiving the first set of path metrics and selecting a first path metric from the first set of path metrics, and for receiving the second set of path metrics and selecting a second path metric from the second set of path metrics. When the first path metric is less than the second path metric, the control circuit selects the third signal as the output of the Viterbi detector. When the second path metric is less than the first path metric, the control circuit selects the fourth signal as the output of the Viterbi detector. The first path metric is the minimum value of the first set of path metrics, and the second path metric is the minimum value of the second set of path metrics.

According to the object of the invention, it provides a Viterbi detector for extending the tolerable extent of the direct current (DCC) bias, for receiving a first signal. The Viterbi detector includes a first and second branch metric calculation circuits, a first and second add-compare-select (ACS) circuits, a path memory unit, and a control circuit. The first branch metric calculation circuit is for receiving the first signal and an equalization-aimed value increased by $\alpha\%$ and outputting a first set of branch metrics. The second branch metric calculation circuit is for receiving the first signal and an equalization-aimed value decreased by $\alpha\%$ and outputting a second set of branch metrics. The first ACS circuit is for receiving the first set of branch metrics and outputting a first set of path control signals and a first set of path metrics. The second ACS circuit is for receiving the second set of branch metrics and outputting a second set of path control signals and a second set of path metrics. The path memory unit is for outputting an output signal of the Viterbi detector. The control circuit is for receiving the first set of path metrics and selecting a first path metric from the first set of path metrics, and for receiving the second set of path metrics and selecting a second path metric from the second set of path metrics. When the first path metric is less than the second path metric, the control circuit selects the first set of path metrics and outputs the first set of path metrics to the path memory unit. When the second path metric is less than the first path metric, the control circuit selects the second set of path metrics and outputs the second set of path metrics to the path memory unit. The first path metric is the minimum value of the first set of path metrics, and the second path metric is the minimum value of the second set of path metrics.

According to the object of the invention, it provides a Viterbi detector for extending the tolerable extent of the direct current (DC) bias, for receiving a first signal. The Viterbi detector includes a branch metric calculation circuit, a add-compare-select (ACS) circuit, a path memory unit, and a control circuit. The branch metric calculation circuit is for alternately receiving an equalization-aimed value increased by $\alpha\%$ or an equalization-aimed value decreased by $\alpha\%$ and alternately outputting a first set of branch metrics or a second set of branch metrics. The first set of branch metrics corresponds to the equalization-aimed value increased by $\alpha\%$ and the second set of branch metrics corresponds to the equalization-aimed value decreased by $\alpha\%$. The ACS circuit is for alternately receiving the first set of branch metrics or the second set of branch metrics and for alternately outputting a first set of path control signals and a first set of path metrics, or a second set of path control signals and a second set of path metrics. The path memory unit is for outputting an output signal of the Viterbi detector. The control circuit is for controlling the alternate receive and output operations in the branch metric calculation circuit and the ACS circuit, for receiving the first set of path metrics and selecting a first path metric from the first set of path metrics, and for receiving the second set of path metrics and selecting a second path metric from the second set of path metrics. When the first path metric is less than the second path metric, the control circuit selects the first set of path metrics and outputs the first set of path metrics to the path memory unit. When the second path metric is less than the first path metric, the control circuit selects the second set of path metrics and outputs the second set of path metrics to the path memory unit. The first path metric is the minimum value of the first set of path metrics, and the second path metric is the minimum value of the second set of path metrics.

BRIEF DESCRIPTION OF THE DRAWINGS

Other objects, features, and advantages of the invention will become apparent from the following detailed description of the preferred but non-limiting embodiments. The description is made with reference to the accompanying drawings in which:

FIG. 2 (Prior Art) illustrates the waveforms of the signals involved in FIG. 1;

DESCRIPTION OF THE PREFERRED EMBODIMENT

Figure 7:
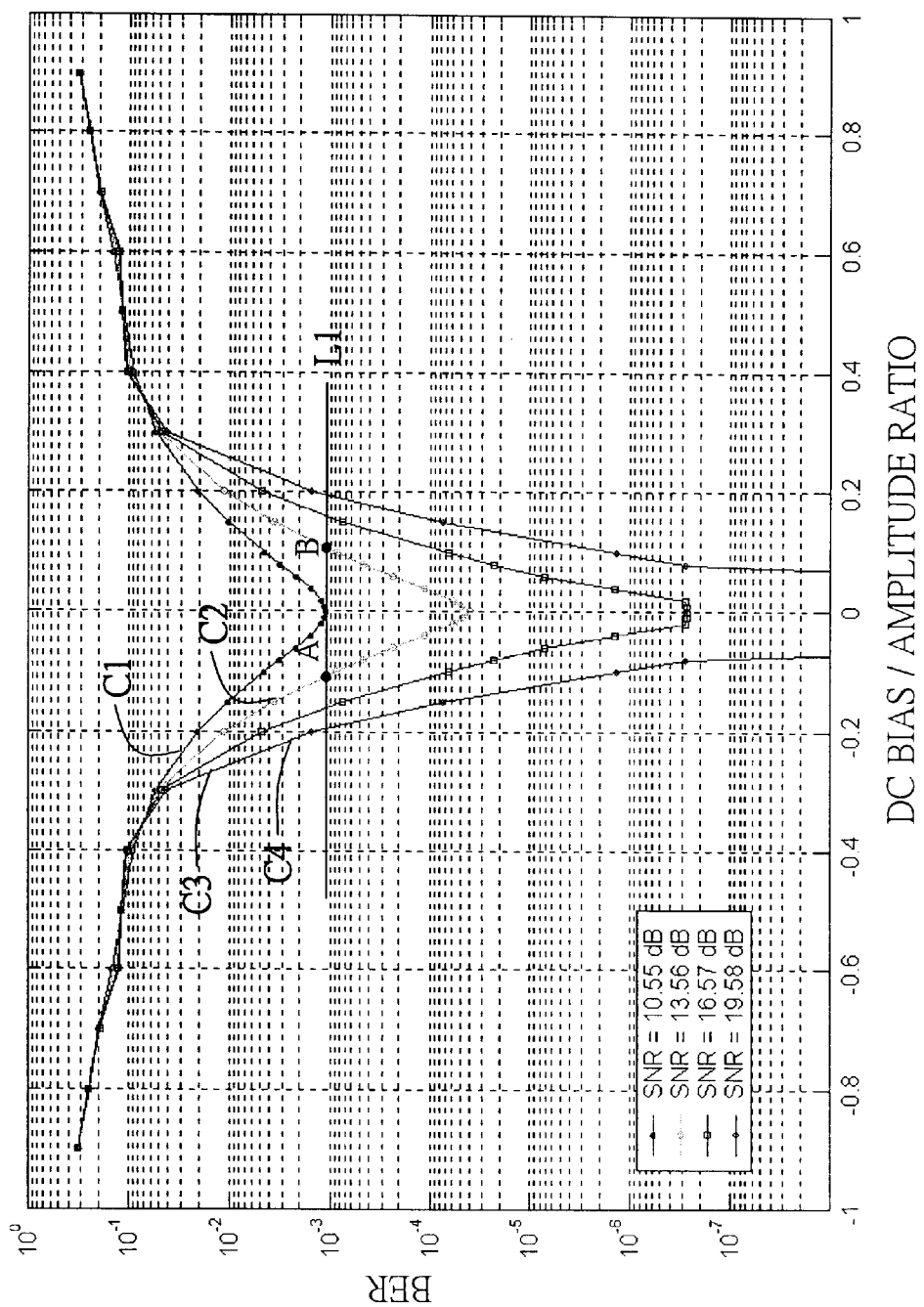
FIG. 7 illustrates the characteristics of the bit error rate (BER) of output signal of a Viterbi detector versus the ratio of DC bias to the output signal amplitude of a PR equalizer with different DC bias for various SNR.

Referring to FIG. 7, it illustrates the characteristics of the bit error rate (BER) of output signal of a Viterbi detector versus the ratio of DC bias to the output signal amplitude of a PR equalizer with different DC bias for various SNR. The result of FIG. 7 is obtained by using computer simulation. In the following, the ratio of DC bias (DC_bias) to the output signal amplitude (Amplitude) of the PR equalizer is denoted as DC_bias_ratio, where DC_bias_ratio=DC_bias/Amplitude.

In FIG. 7, curves C1, C2, C3, and C4 represent the characteristics of the DC bias ratio and the BER for SNR equal to 10.55, 13.56, 16.57, and 19.58 dB respectively. Each of the curves corresponds to a function, BER=f(DC_bias_ratio, SNR). They can be used for the determination of the system parameters for the requirements of specific SNR and BER. For instance, if a system requires output signal Z of the Viterbi detector with SNR less than 13.56 dB and BER less than $10^{-3}$, by FIG. 7, the region that satisfies this condition is the inside region encompassed by the straight line L1 and the curve C2. The intersections of the line L1 and the curve C2 are the points A and B, and the corresponding DC bias ratios at the two points are about −0.1 and +0.1 respectively. In this way, when the DC bias ratio of the PR equalizer's output signal J is $\alpha'$, where $\alpha' <= |0.1|$, the output signal J fulfils the above system requirements.

Figure 1:
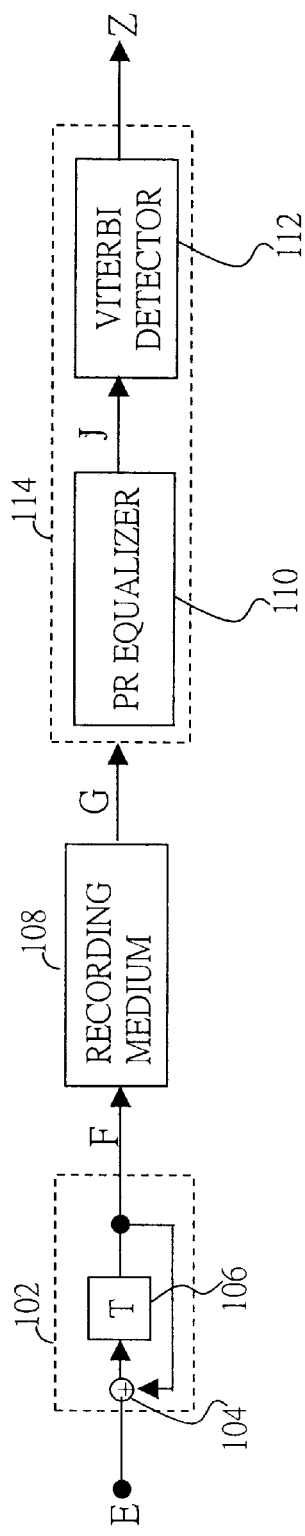
FIG. 1 (Prior Art) is a block diagram of a PRML signal processing apparatus.
Figure 3:
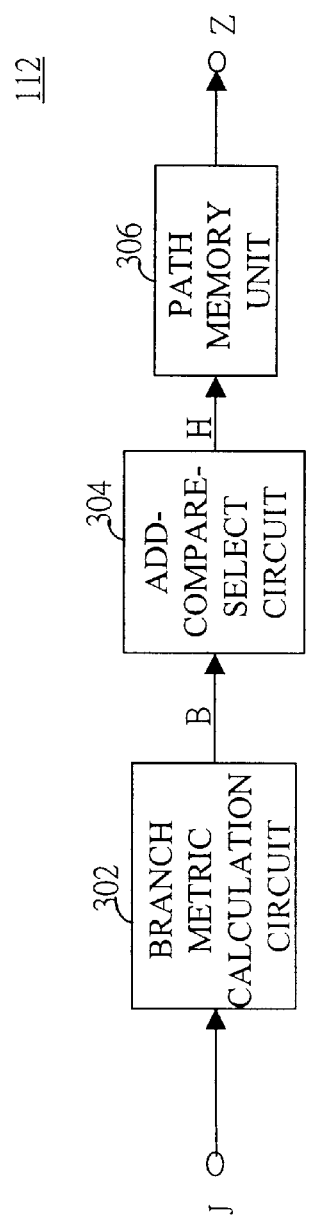
FIG. 3 (Prior Art) is a block diagram of the Viterbi detector 112 in FIG. 1.
Figure 4:
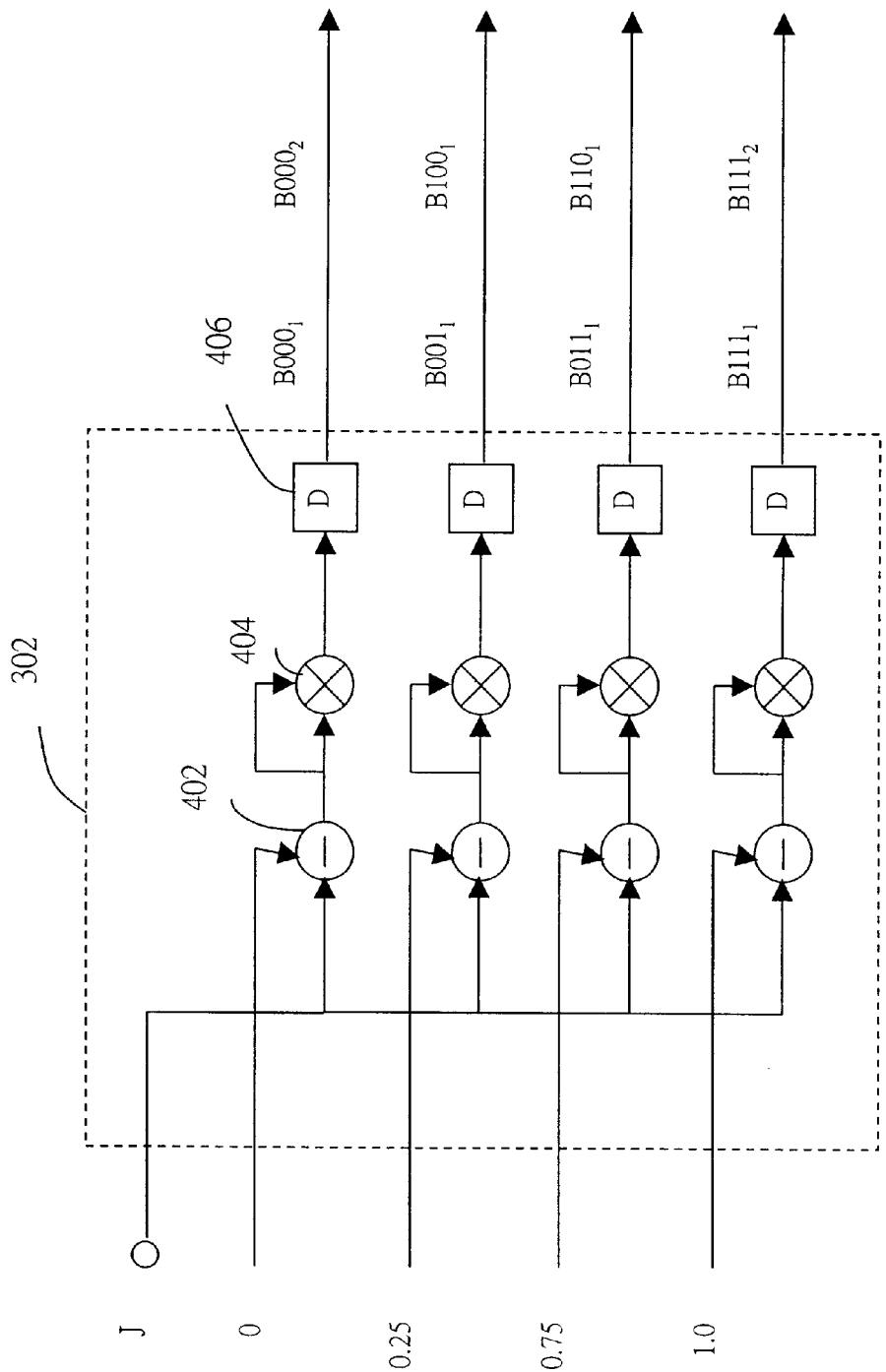
FIG. 4 (Prior Art) a block diagram of the branch metric calculation circuit in FIG. 3.
Figure 5A:
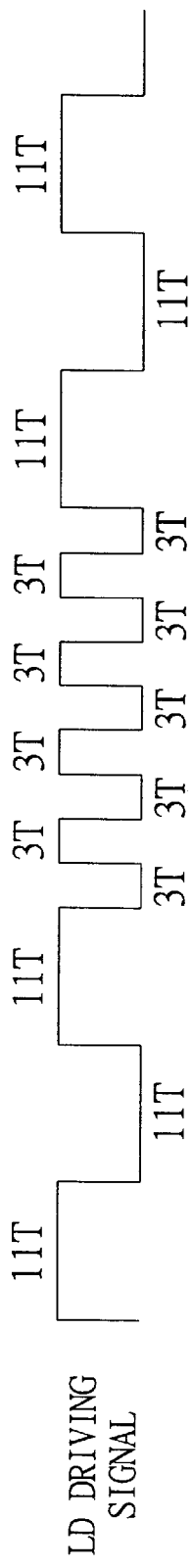
FIG. 5A (Prior Art) is the waveform diagram of the LD driving signal.
Figure 5B:
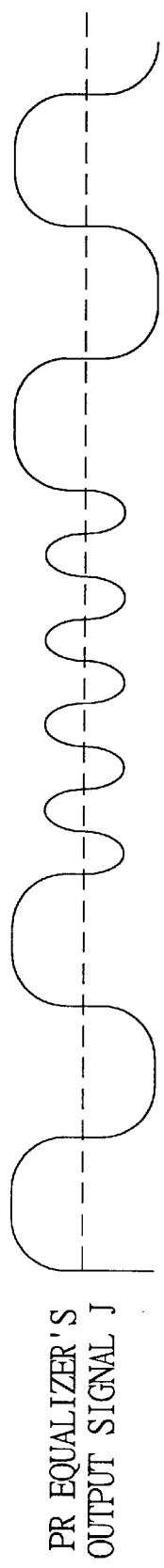
FIG. 5B (Prior Art) is the ideal PR equalizer's output signal J.
Figure 5C:
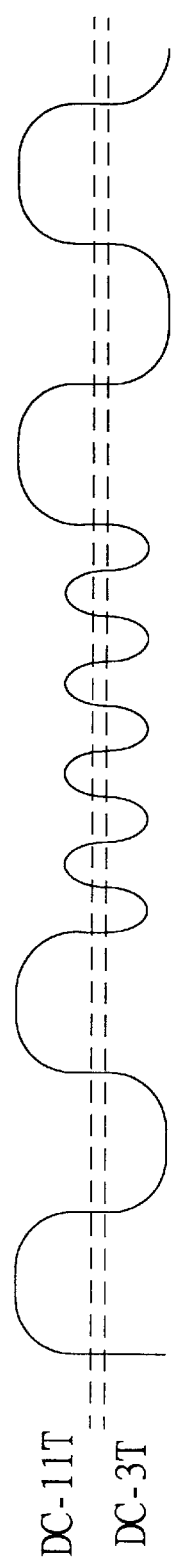
FIG. 5C (Prior Art) is the PR equalizer's output signal in practice.
Figure 6A:
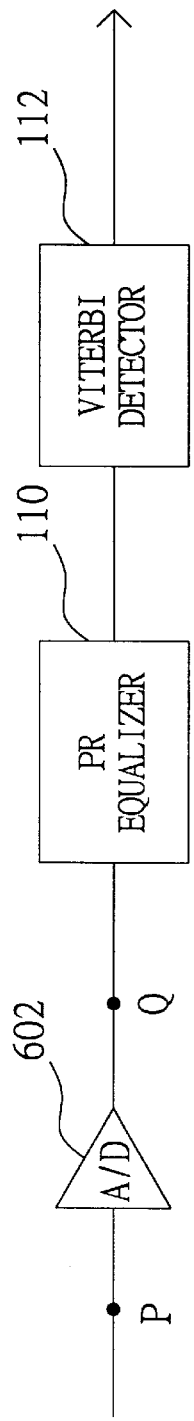
FIGS. 6A–6C (Prior Art) illustrate another circuit structure and corresponding waveforms when DC bias occurs.
Figure 6B:
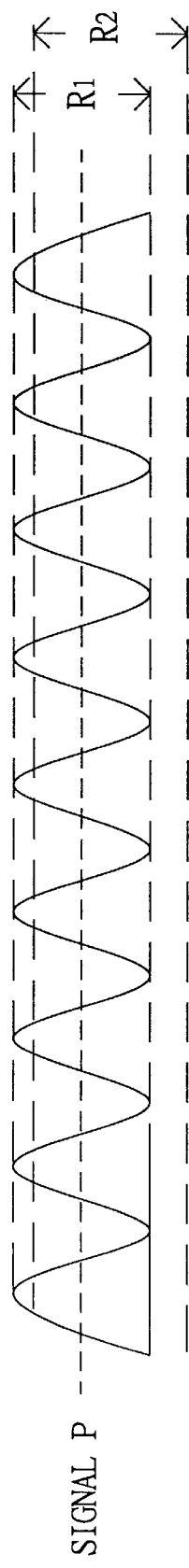
Figure 6C:
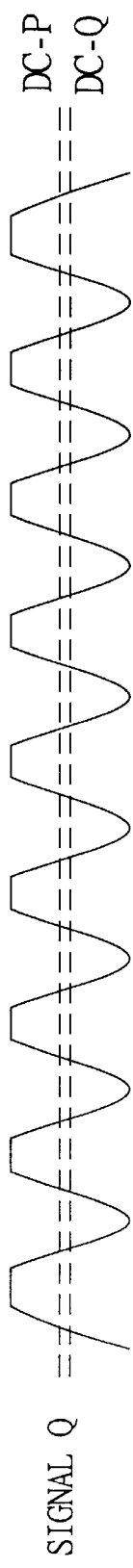
Figure 8:
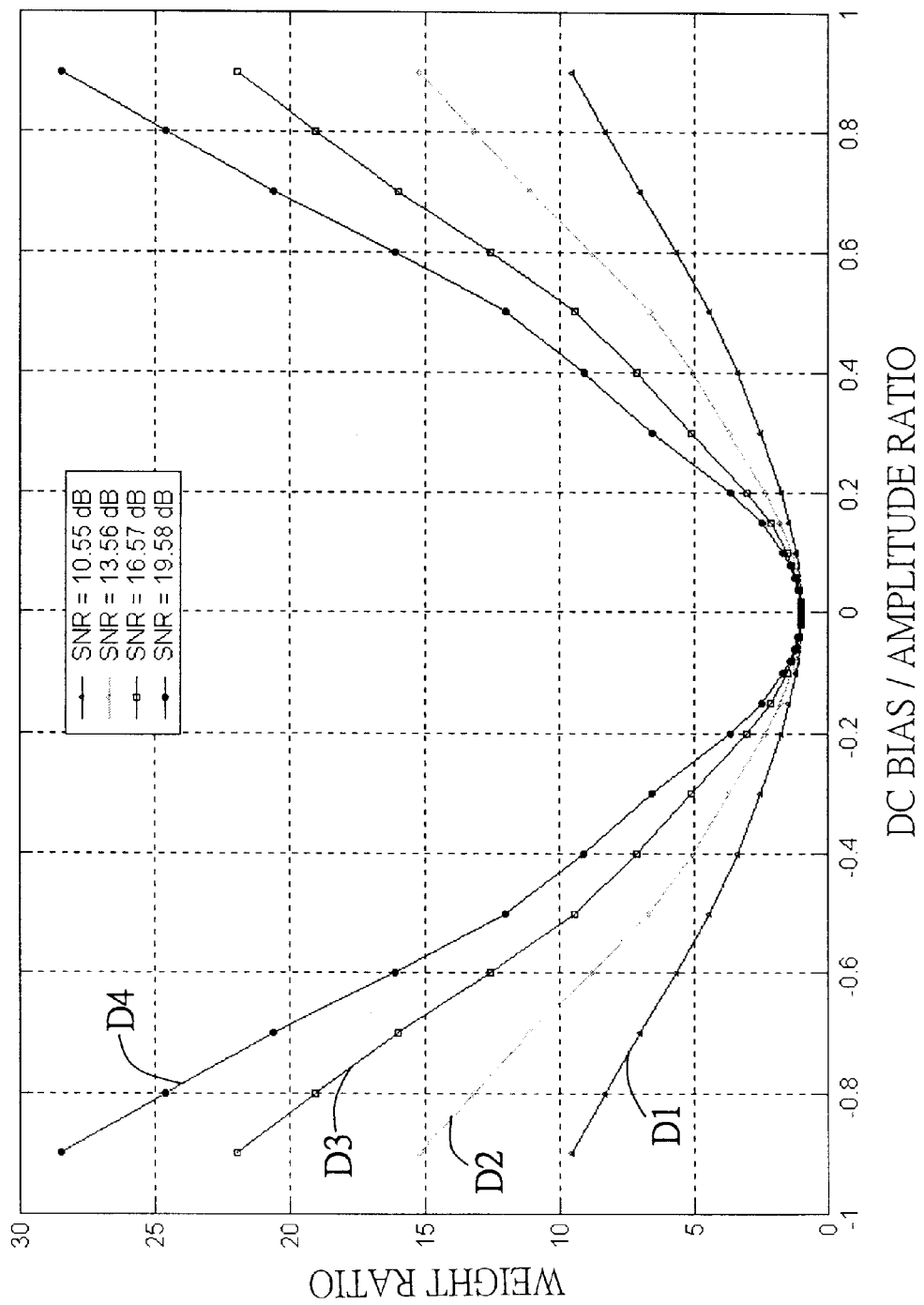
FIG. 8 illustrates the characteristics of the weight ratio versus the ratio of DC bias to the output signal amplitude of the PR equalizer with different DC bias for various SNR.

Referring to FIG. 8, it illustrates the characteristics of the weight ratio versus the ratio of DC bias to the output signal amplitude of the PR equalizer with different DC bias for various SNR. FIG. 8 shows the results performed by computer simulation. In FIG. 8, weight ratio is equal to ratio of the minimum path metric for the add-compare-select (ACS) circuit of the Viterbi detector to the minimum path metric for the ACS circuit with no DC bias. For instance, when performing PR(1, 2, 1) equalization, the minimum path metric for the ACS circuit can be the minimum value of the six path metrics, P000, P001, P011, P100, P110, and P111, as shown in FIG. 3.

In FIG. 8, curves D1, D2, D3, and D4 represent the characteristics of the weight ratio versus the DC bias ratio of the PR equalizer's output signal J for SNR equal to 10.55, 13.56, 16.57, and 19.58 dB respectively. Each of the curves corresponds to a function, weight=g(DC_bias_ratio, SNR).

As can be seen in FIG. 8, for a certain SNR, the DC bias ratio increases as the weight ratio increases. Moreover, when the SNR becomes greater, the slope of the curve of the function weight=g(DC_bias_ratio, SNR) becomes greater. In addition, each curves has the minimum point at (0, 1).

For extending the tolerable extent of the DC bias according to the invention, the equalization-aimed values received by the branch metric calculation circuit can be respectively increased or decreased by $\alpha_0\%$. Take the PR(1, 2, 1) equalization as an example, the equalization-aimed values {0, 0.25, 0.75, 1} are respectively increased or decreased by $\alpha_0\%$.

Figure 9:
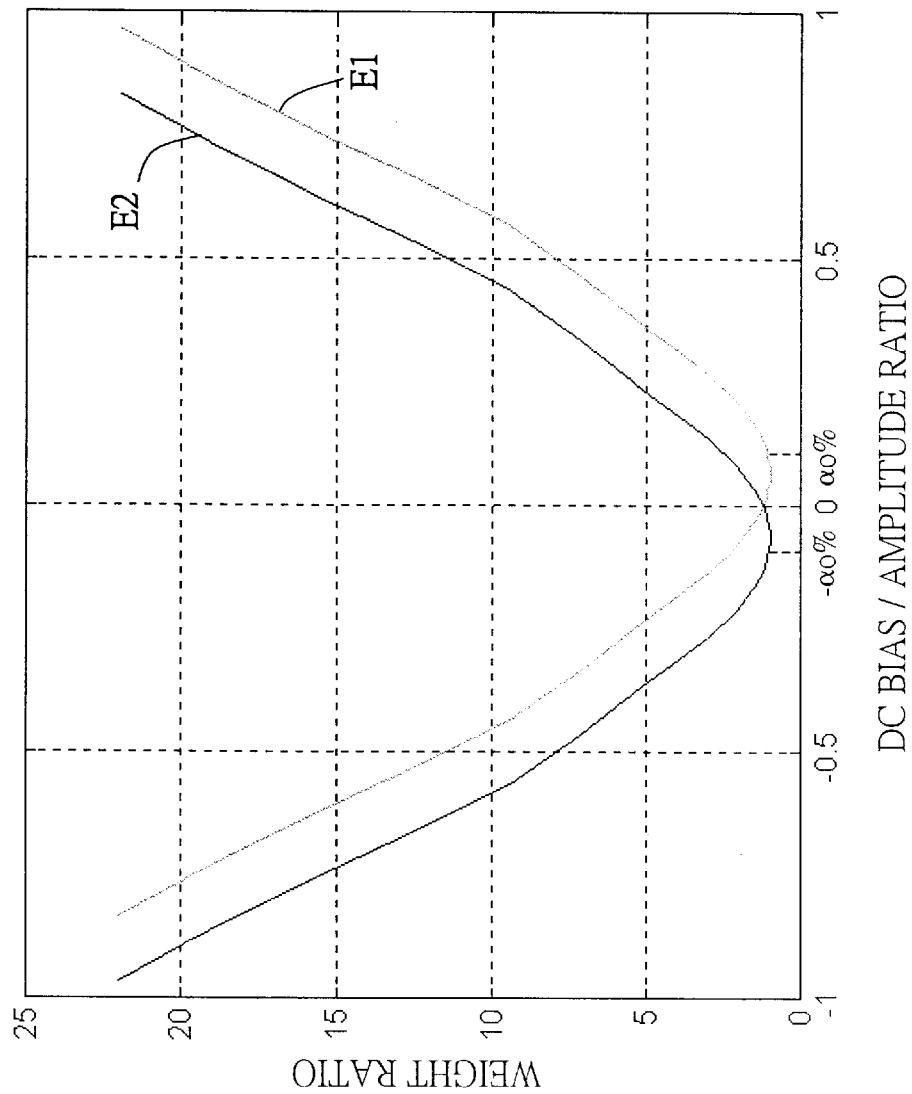
FIG. 9 illustrates the characteristics of the weight ratio versus the ratio of DC bias to the output signal amplitude of the PR equalizer with different DC bias for SNR=16.57 dB when the equalization-aimed values increased or decreased by $\alpha_0\%$ are inputted into the branch metric calculation circuit.

FIG. 9 illustrates the characteristics of the weight ratio versus the DC bias ratio for the PR equalizer with different DC bias for SNR=16.57 dB when the equalization-aimed values increased or decreased by $\alpha_0\%$ are inputted into the branch metric calculation circuit. In FIG. 9, the characteristics of the weight ratio versus the DC bias ratio for the equalization-aimed values increased by $\alpha_0\%$ is represented by the curve E1 while that for the equalization-aimed values decreased by $\alpha_0\%$ is represented by the curve E2. As compared with the curve D3 for SNR=16.57 dB in FIG. 8, the curve E1 is the curve D3 shifted to the right by $\alpha_0\%$ while the curve E2 is the curve D3 shifted to the left by $\alpha_0\%$.

Thus, for extending the tolerable extent of the DC bias according to the invention, when the DC bias of the PR equalizer's output signal J is greater than zero, the equalization-aimed values increased by $\alpha_0\%$ are inputted into the branch metric calculation circuit. When the DC bias of the PR equalizer's output signal J is less than zero, the equalization-aimed values decreased by $\alpha_0\%$ are inputted into the branch metric calculation circuit. In this way, in FIG. 9, when the DC bias is greater than zero, the curve E1 is taken. From FIG. 9, for the same DC bias, the weight ratio of the curve E1 is less than that of the curve E2. When the DC bias is less than zero, the curve E2 is taken. From FIG. 9, for the same DC bias, the weight ratio of the curve E2 is less than the weight ratio of the curve E1. Therefore, the purpose of the invention can be achieved by comparing the weight ratio of the curve E1 with the weight ratio of the curve E2 and determining which curve should be employed. In other words, the minimum value outputted by the ACS circuit is selected, resulting in a corresponding output of the path memory unit.

As can be inspected from FIGS. 8 and 9, when the SNR becomes greater, the slope of the curve of the function weight=g(DC_bias_ratio, SNR) becomes greater. In this case, it is easy to determine which curve has less weight ratio because the difference between the two curves E1 and E2 is greater. Thus, the error in the determination is low.

Figure 10:
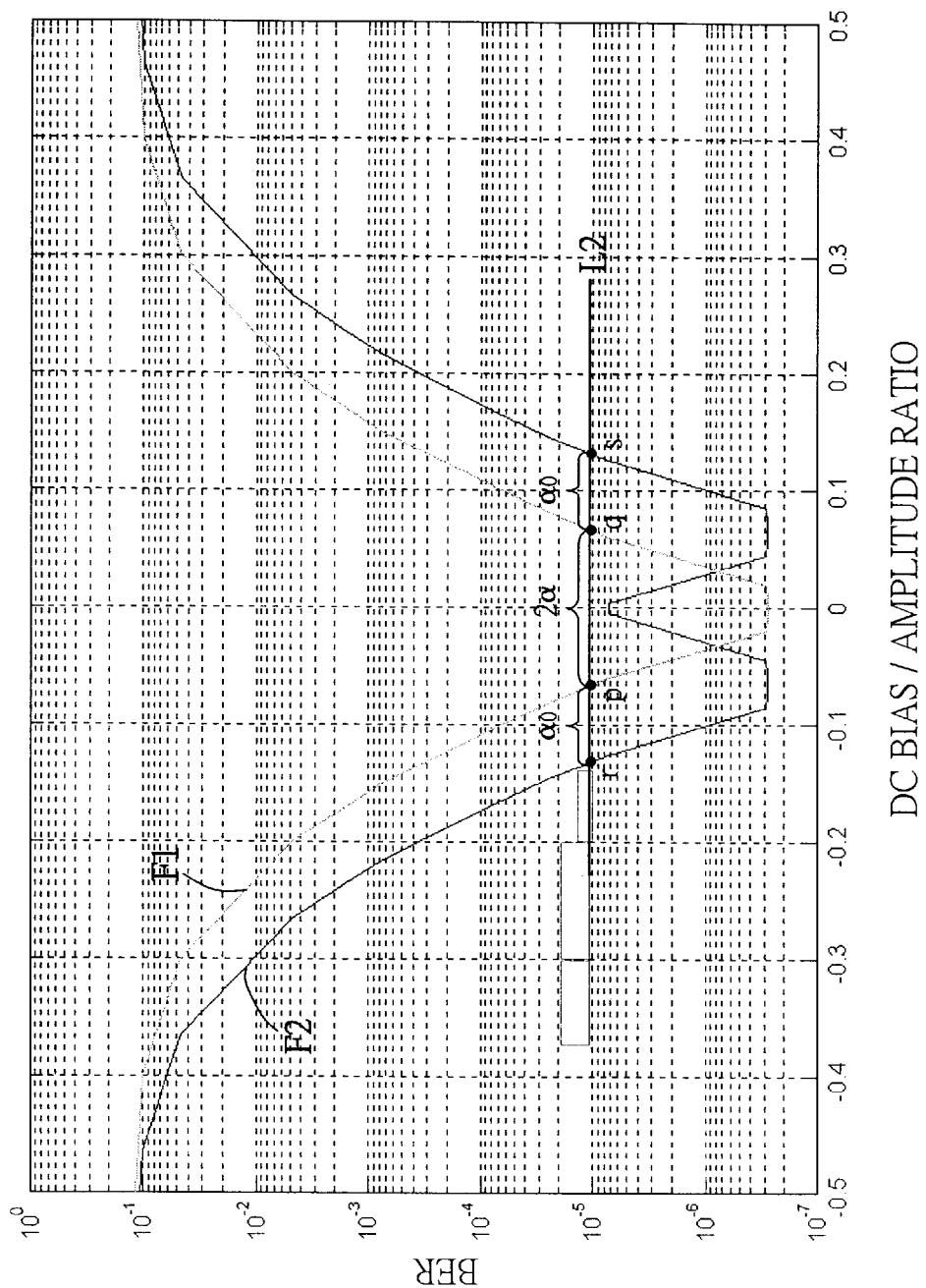
FIG. 10 illustrates the characteristics of the BER of output signal of the Viterbi detector versus the ratio of DC bias to the output signal amplitude of the PR equalizer with different DC bias for SNR=16.57 dB when the equalization-aimed values increased by $\alpha\%$ or decreased by $\alpha\%$ are respectively inputted into the branch metric calculation circuit.

Referring to FIG. 10, it illustrates the characteristics of the BER of output signal Z of the Viterbi detector versus the DC bias ratio for the PR equalizer with different DC bias for SNR=16.57 dB when the equalization-aimed values increased by $\alpha\%$ or decreased by $\alpha\%$ are respectively inputted into the branch metric calculation circuit. In FIG. 10, curve F1 corresponds to the curve C3 obtained from the conventional approach while curve F2 is the combination of the part of the curve F1 shifted to the right by $\alpha_0\%$ corresponding to DC bias greater than zero and the part of the curve F1 shifted to the left by $\alpha_0\%$ corresponding to DC bias less than zero.

In the conventional Viterbi detector, when it is required that the system SNR is below 16.57 dB and the BER must be less than $10^{-5}$, the region in FIG. 10 satisfying the requirements is the joint region of the region below the line L2 and the inner region of the curve F1. The intersections of the line L2 and the curve F1 are points p and q, corresponding to the tolerable extent of DC bias of $2\alpha$. On the other hand, in the Viterbi detector according to the invention, when it is required that the system SNR is below 16.57 dB and the BER must be less than $10^{-5}$, the region in FIG. 10 satisfying the requirements is the joint region of the region below the line L2 and the inner region of the curve F2. The intersections of the line L2 and the curve F2 are points r and s, corresponding to the tolerable extent of DC bias of $2\alpha+2\alpha_0$. In order to make the BER meet the requirement, $\alpha_0$ must be less than or equal to $\alpha$. Therefore, the maximum tolerable extent of DC bias is $4\alpha$, i.e. the tolerable extent of DC bias is increased by 100% as compared with the extent in the conventional approach.

Thus, according to the invention, using the equalization-aimed values increased by $\alpha\%$ or decreased by $\alpha\%$ as the inputs to the ACS circuits respectively and selecting the output of the ACS circuits with the minimum weight ratio, the object of extending the tolerable extent of DC bias is achieved.

Figure 11:
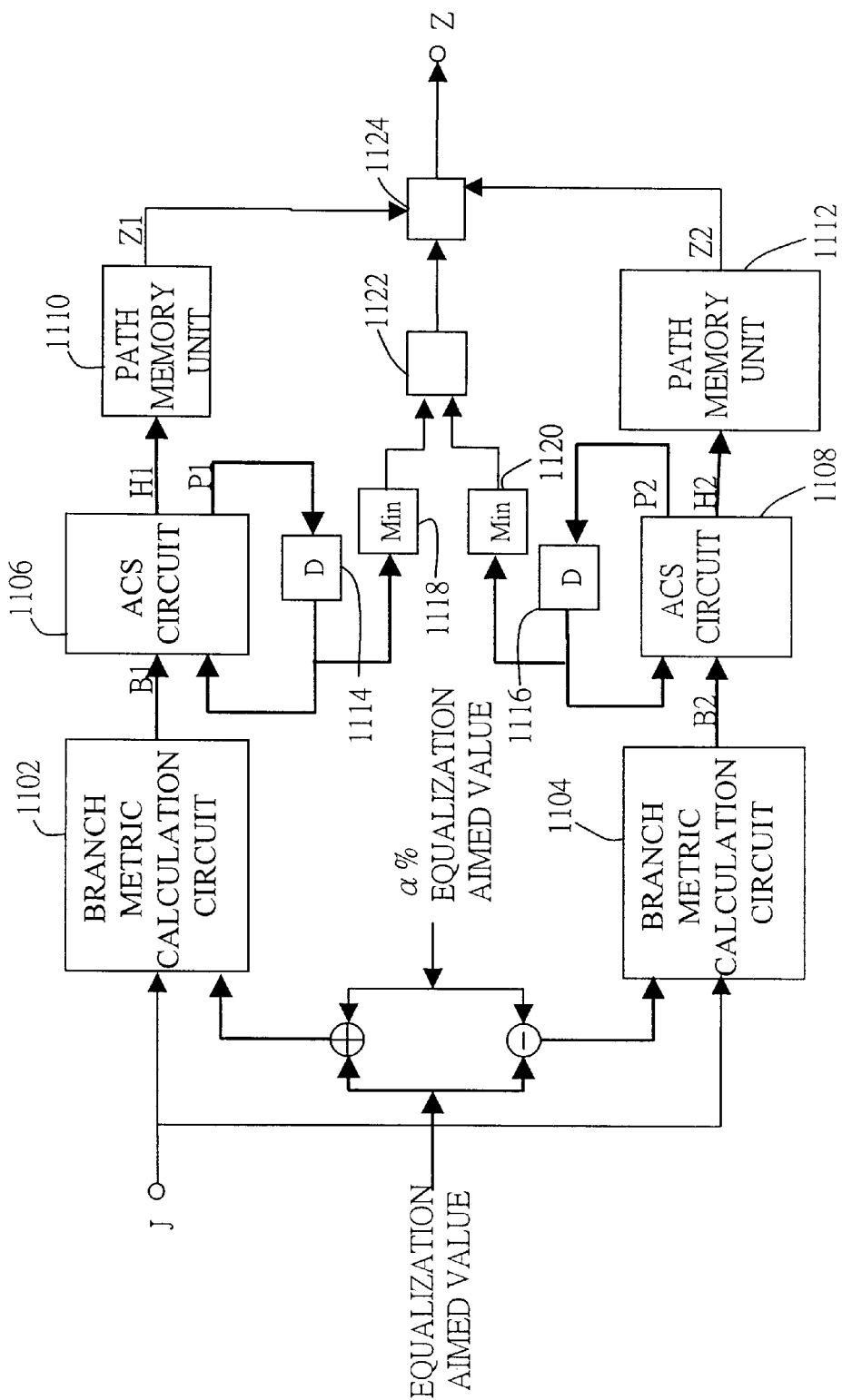
FIG. 11 is a block diagram of a Viterbi detector for extending the tolerable extent of the DC bias according to a preferred embodiment of the invention.

Referring to FIG. 11, it illustrates a Viterbi detector for extending the tolerable extent of the DC bias according to a preferred embodiment of the invention in block diagram form. The Viterbi detector 1100 includes branch metric calculation circuits 1102 and 1104, ACS circuits 1106 and 1108, and path memory units 1110 and 1112. The branch metric calculation circuit 1102 receives the PR equalizer's output signal J and an equalization-aimed value increased by α% while the branch metric calculation circuit 1104 receives the output signal J and an equalization-aimed value decreased by α%. Next, the branch metric calculation circuits 1102 and 1104 output the corresponding sets of branch metrics B1 and B2 to the ACS circuits 1106 and 1108 respectively. The ACS circuits 1106 and 1108 receive the sets of branch metrics B1 and B2, and output the corresponding sets of path metrics P1 and P2 to the registers 1114 and 1116 respectively. In addition, the ACS circuits 1106 and 1108 output the sets of path control signals H1 and H2 to the path memory units 1110 and 1112. The path memory units 1110 and 1112 then output signals Z1 and Z2 respectively.

The sets of path metrics P1 and P2 are inputted to minimum value selecting units 1118 and 1120. The minimum value selecting unit 1118 is for selecting the minimum value of the set of path metrics P1 while the minimum value selecting unit 1120 is for selecting the minimum value of the set of path metrics P2. For instance in the process of the signal J obtained from the PR(1, 2, 1) equalization, the output of the minimum value selecting unit 1118 or 1120 is one of the path metrics, P000, P001, P011, P100, P110, and P111.

Comparator 1122 is then for comparing the outputs of the minimum value selecting units 1118 and 1120 and the comparison result is inputted into selector 1124. The selector 1124 is for selecting the output of the path memory unit which corresponds to the less one in the comparison performed the comparator 1122 and then taking the selected output of the path memory unit as the output signal Z of the Viterbi detector. In other words, when the minimum path metric of the ACS circuit 1106 is less than the minimum path metric of the ACS circuit 1108, the signal Z1 is taken as the output signal of the Viterbi detector. When the minimum path metric of the ACS circuit 1108 is less than the minimum path metric of the ACS circuit 1106, the signal Z2 is taken as the output signal of the Viterbi detector.

Figure 12:
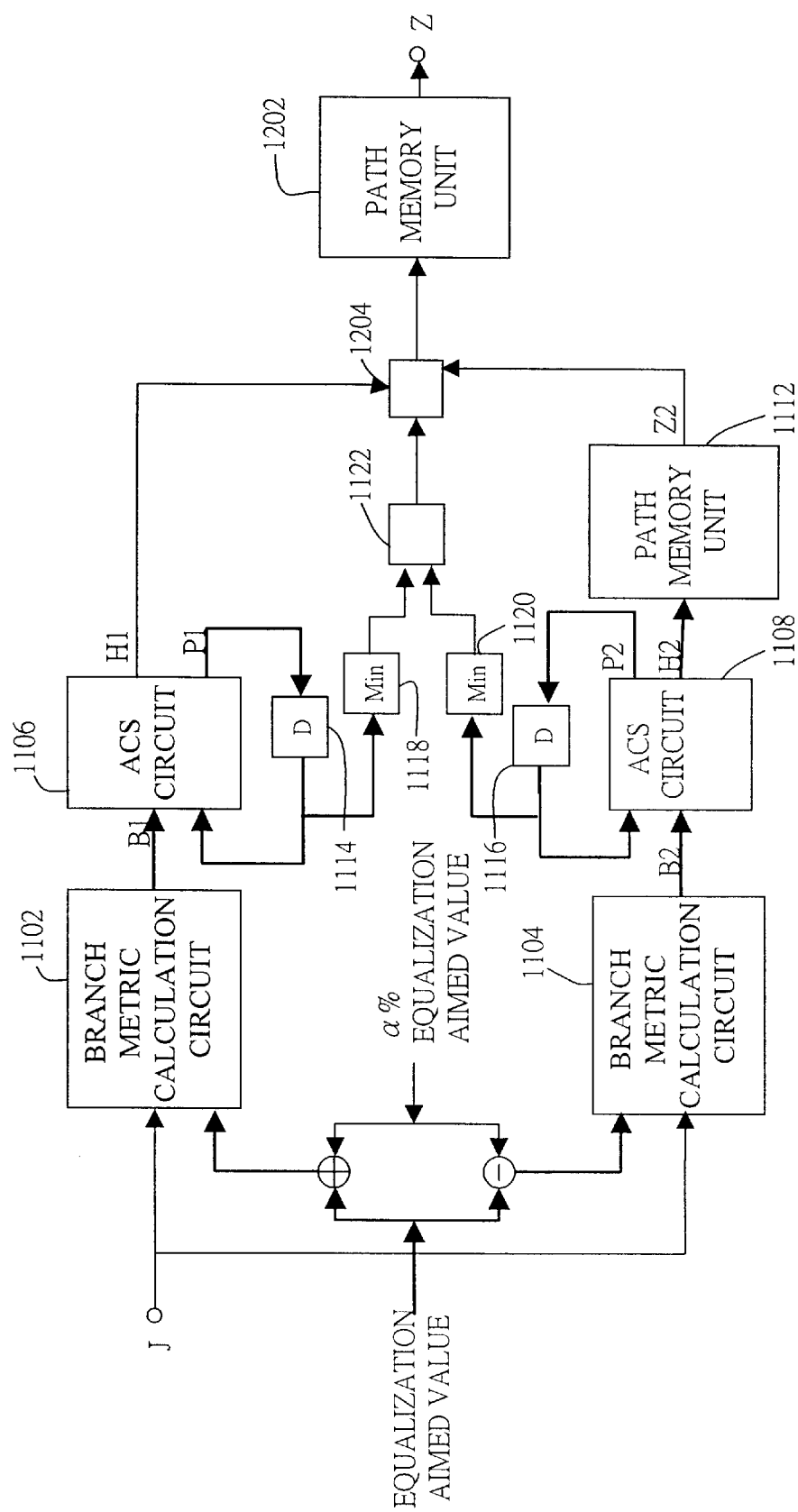
FIG. 12 is a block diagram of another example of the Viterbi detector for extending the tolerable extent of the DC bias according to the preferred embodiment of the invention.

For the sake of simplicity, referring now to FIG. 12, it illustrates another example of the Viterbi detector for extending the tolerable extent of the DC bias according to the preferred embodiment of the invention. Unlike the FIG. 11, selector 1204 selects either the path control signal H1 or H2 as the input to path memory unit 1202 according to the output of the comparator 1122 and the output of the path memory unit 1202 is the output signal Z of the Viterbi detector.

Figure 13:
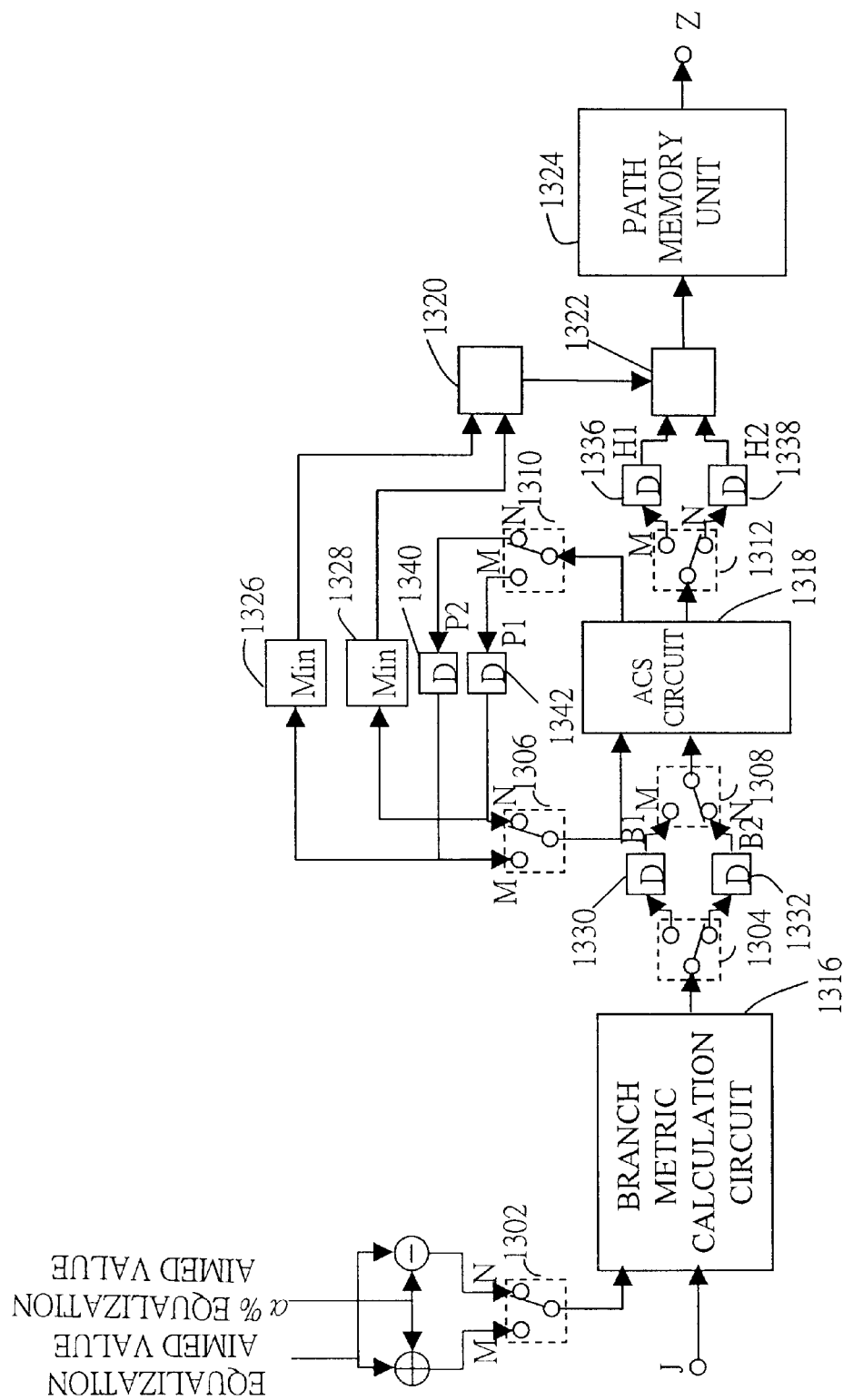
FIG. 13 is a block diagram of another example of the Viterbi detector for extending the tolerable extent of the DC bias according to the preferred embodiment of the invention.

FIG. 13 is a block diagram of another example of the Viterbi detector for extending the tolerable extent of the DC bias according to the preferred embodiment of the invention. When the system operating frequency is fast enough to operate in coordination, the Viterbi detector as shown in FIG. 13 can be employed for a more simplified circuitry. In FIG. 13, switch 1302 is used for the branch metric calculation circuit 1316 to alternately receive an equalization-aimed value increased by α% or an equalization-aimed value decreased by α%. Then, by switch 1304, the branch metric calculation circuit 1316 outputs the sets of branch metrics B1 and B2 to registers 1330 or 1332 alternately. The set of branch metrics B1 corresponds to the equalization-aimed value increased by α% and the set of branch metrics B2 corresponds to the equalization-aimed value decreased by α%.

By switch 1308, the ACS circuit 1318 alternately receives the set of branch metrics B1 stored in the register 1330 or the set of branch metrics B2 stored in the register 1332. In the ACS 1318 circuit, a set of path control signals H1 and a set of path metrics P1 can be obtained by using the set of branch metrics B1, or a set of path control signals H2 and a set of path metrics P2 can be obtained by using the set of branch metrics B2. The sets of path metrics P1 and P2 are alternately written into the registers 1340 and 1342 respectively by the switch 1310 while the sets of path control signals H1 and H2 are written into the registers 1336 and 1338 respectively by the switch 1312.

After that, the sets of path metrics P1 and P2 stored in the registers 1340 and 1342 respectively are outputted to the minimum value selecting units 1326 and 1328 respectively. The minimum value selecting units 1326 is for selecting the minimum value of the set of path metrics P1 and outputting the minimum path metric of P1 while is the minimum value selecting units 1328 is for selecting the minimum value of the set of path metrics P2 and outputting the minimum path metric of P2. Comparator 1320 is then for comparing the minimum path metric of P1 with the minimum path metric of P2 and 1120 and the comparison result is inputted into a selector 1322. The selector 1322 is for selecting the sets of path control signal H1 or H2 as the input to the path memory unit 1324.

At specific points of time, for instance, t, t+2, t+4, ..., every switch is switched to its terminal M for the branch metric calculation circuit 1316 and the ACS circuit 1318 to perform operations corresponding to the equalization-aimed value increased by α%. For another specific points of time, for instance, t+1, t+3, t+5, ..., every switch is switched to its terminal N for the branch metric calculation circuit 1316 and the ACS circuit 1318 to perform operations corresponding to the equalization-aimed value decreased by α%. In addition, FIG. 13 illustrates the branch metric calculation circuit 1316 and the ACS circuit 1318 during performing operations corresponding to the equalization-aimed value increased by α%.

Therefore, the purpose of providing a Viterbi detector for extending the tolerable extent of the DC bias can be achieved by the conventional Viterbi detector containing a branch metric calculation circuit, ACS circuit, and path memory unit plus the control circuit including a number of registers and switches, a comparator like the comparator 1320 and a selector like the 1322 for selecting the path control signals H1 and H2 to the path memory unit 1324.

The disclosure above provides a Viterbi detector for extending the tolerable extent of DC bias according to the preferred embodiment of the invention. By adding a fixed value to a reference level or subtracting a fixed value from the reference level, the tolerable extent of the DC bias of the input signal is increased. According to the invention, this effect can be achieved with a number of control circuits and the tolerable extent of the DC bias can be increased by about 100% as compared with the tolerable extent of the DC bias in the conventional approaches to the problems.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A Viterbi detector for extending tolerable extent of direct current (DC) bias, for receiving a first signal, the Viterbi detector comprising:

a first branch metric calculation circuit and a second branch metric calculation circuit, the first branch metric calculation circuit for receiving the first signal and an equalization-aimed value increased by α% and outputting a first set of branch metrics, the second branch metric calculation circuit for receiving the first signal and an equalization-aimed value decreased by α% and outputting a second set of branch metrics;

a first add-compare-select (ACS) circuit and a second ACS circuit, the first ACS circuit for receiving the first set of branch metrics and outputting a first set of path control signals and a first set of path metrics, and the second ACS circuit for receiving the second set of branch metrics and outputting a second set of path control signals and a second set of path metrics;

a first path memory unit and a second path memory unit, the first path memory unit for receiving the first set of path control signals and outputting a third signal, the second path memory unit for receiving the second set of path control signals and outputting a fourth signal; and a control circuit for receiving the first set of path metrics and selecting a first path metric from the first set of path metrics, and for receiving the second set of path metrics and selecting a second path metric from the second set of path metrics, the control circuit selecting the third signal as the output of the Viterbi detector when the first path metric is less than the second path metric, the control circuit selecting the fourth signal as the output of the Viterbi detector when the second path metric is less than the first path metric, wherein the first path metric is the minimum value of the first set of path metrics, and the second path metric is the minimum value of the second set of path metrics.

2. The Viterbi detector according to claim 1, wherein the control circuit comprises a first minimum value selecting unit and a second minimum value selecting unit, the first minimum value selecting unit is for receiving the first set of path metrics and outputting the first path metric, and the second minimum value selecting unit is for receiving the second set of path metrics and outputting the second path metric.

3. The Viterbi detector according to claim 1, wherein the control circuit comprises a comparator for comparing the first path metric with the second path metric.

4. The Viterbi detector according to claim 3, wherein the control circuit comprises a selector, coupled to the comparator, for selecting either the third or fourth signal as the output of the Viterbi detector.

5. A Viterbi detector for extending tolerable extent of direct current (DC) bias, for receiving a first signal, the Viterbi detector comprising:

a first branch metric calculation circuit and a second branch metric calculation circuit, the first branch metric calculation circuit for receiving the first signal and an equalization-aimed value increased by α% and outputting a first set of branch metrics, the second branch metric calculation circuit for receiving the first signal and an equalization-aimed value decreased by α% and outputting a second set of branch metrics;

a first add-compare-select (ACS) circuit and a second ACS circuit, the first ACS circuit for receiving the first set of branch metrics and outputting a first set of path control signals and a first set of path metrics, and the second ACS circuit for receiving the second set of branch metrics and outputting a second set of path control signals and a second set of path metrics;

a path memory unit for outputting an output signal of the Viterbi detector; and a control circuit for receiving the first set of path metrics and selecting a first path metric from the first set of path metrics, and for receiving the second set of path metrics and selecting a second path metric from the second set of path metrics, the control circuit selecting the first set of path metrics and outputting the first set of path metrics to the path memory unit when the first path metric is less than the second path metric, the control circuit selecting the second set of path metrics and outputting the second set of path metrics to the path memory unit when the second path metric is less than the first path metric, wherein the first path metric is the minimum value of the first set of path metrics, and the second path metric is the minimum value of the second set of path metrics.

6. The Viterbi detector according to claim 5, wherein the control circuit comprises a first minimum value selecting unit and a second minimum value selecting unit, the first minimum value selecting unit is for receiving the first set of path metrics and outputting the first path metric, and the second minimum value selecting unit is for receiving the second set of path metrics and outputting the second path metric.

7. The Viterbi detector according to claim 5, wherein the control circuit comprises a comparator for comparing the first path metric with the second path metric.

8. The Viterbi detector according to claim 7, wherein the control circuit comprises a selector, coupled to the comparator, for selecting either the first set of control signals or the second set of control signals as the input to the path memory unit.

9. A Viterbi detector for extending tolerable extent of direct current (DC) bias, for receiving a first signal, the Viterbi detector comprising:

a branch metric calculation circuit for alternately receiving an equalization-aimed value increased by 60 % or an equalization-aimed value decreased by α% and alternately outputting a first set of branch metrics or a second set of branch metrics, wherein the first set of branch metrics corresponds to the equalization-aimed value increased by α% and the second set of branch metrics corresponds to the equalization-aimed value decreased by α%;

a add-compare-select (ACS) circuit for alternately receiving the first set of branch metrics or the second set of branch metrics and for alternately outputting a first set of path control signals and a first set of path metrics, or a second set of path control signals and a second set of path metrics;

a path memory unit for outputting an output signal of the Viterbi detector; and a control circuit for controlling the alternate receive and output operations in the branch metric calculation circuit and the ACS circuit, for receiving the first set of path metrics and selecting a first path metric from the first set of path metrics, and for receiving the second set of path metrics and selecting a second path metric from the second set of path metrics, the control circuit selecting the first set of path metrics and outputting the first set of path metrics to the path memory unit when the first path metric is less than the second path metric, the control circuit selecting the second set of path metrics and outputting the second set of path metrics to the path memory unit when the second path metric is less than the first path metric, wherein the first path metric is the minimum value of the first set of path metrics, and the second path metric is the minimum value of the second set of path metrics.

10. The Viterbi detector according to claim 9, wherein the control circuit comprises a first minimum value selecting unit and a second minimum value selecting unit, the first minimum value selecting unit is for receiving the first set of path metrics and outputting the first path metric, and the second minimum value selecting unit is for receiving the second set of path metrics and outputting the second path metric.

11. The Viterbi detector according to claim 9, wherein the control circuit comprises a comparator for comparing the first path metric with the second path metric.

12. The Viterbi detector according to claim 11, wherein the control circuit comprises a selector, coupled to the comparator, for selecting either the first control signal or the second control signal as the input to the path memory unit.

13. The Viterbi detector according to claim 9, wherein the control circuit comprises a plurality of switches, respectively coupled to the input and output terminals of the branch metric calculation circuit and the ACS circuit, for controlling the alternate receive and output operations in the branch metric calculation circuit and the ACS circuit.

* * * * *